(12) United States Patent
Kwak

(10) Patent No.: US 9,318,224 B2
(45) Date of Patent: Apr. 19, 2016

(54) NON-VOLATILE MEMORY DEVICE AND OPERATING METHOD THEREOF

(71) Applicant: Donghun Kwak, Hwaseong-Si (KR)

(72) Inventor: Donghun Kwak, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 184 days.

(21) Appl. No.: 14/091,382

(22) Filed: Nov. 27, 2013

(65) Prior Publication Data

US 2014/0164685 A1    Jun. 12, 2014

(30) Foreign Application Priority Data

Dec. 6, 2012 (KR) .................. 10-2012-0140998

(51) Int. Cl.
    *G06F 12/02* (2006.01)
    *G11C 29/00* (2006.01)
    *G11C 16/04* (2006.01)
    *G11C 16/34* (2006.01)

(52) U.S. Cl.
    CPC ............ *G11C 29/82* (2013.01); *G11C 16/0483* (2013.01); *G11C 16/344* (2013.01)

(58) Field of Classification Search
    None
    See application file for complete search history.

(56) References Cited

U.S. PATENT DOCUMENTS

| | | | |
|---|---|---|---|
| 7,536,627 B2 | 5/2009 | Gross et al. | |
| 8,156,403 B2 | 4/2012 | Shalvi et al. | |
| 8,203,211 B2 | 6/2012 | Jeong et al. | |
| 8,995,202 B2 * | 3/2015 | Mu et al. | 365/185.22 |
| 2010/0246260 A1 * | 9/2010 | Kang | 365/185.03 |
| 2010/0269000 A1 | 10/2010 | Lee | |
| 2011/0002169 A1 * | 1/2011 | Li et al. | 365/185.09 |
| 2011/0103149 A1 * | 5/2011 | Katsumata et al. | 365/185.18 |
| 2011/0138111 A1 | 6/2011 | Kim et al. | |
| 2011/0202812 A1 | 8/2011 | Asano et al. | |
| 2012/0008389 A1 | 1/2012 | Kim | |
| 2012/0069664 A1 | 3/2012 | Kim et al. | |
| 2012/0269000 A1 | 10/2012 | Yoon | |
| 2013/0016561 A1 * | 1/2013 | Nam | 365/185.11 |

FOREIGN PATENT DOCUMENTS

| | | |
|---|---|---|
| JP | 2004-145964 | 5/2004 |
| JP | 2011-165063 A | 8/2011 |
| KR | 10-2010-0115970 A | 10/2010 |
| KR | 10-2012-0115970 A | 10/2010 |
| KR | 10-2011-0062543 A | 6/2011 |
| KR | 10-2012-0004026 A | 1/2012 |
| KR | 10-2012-0030817 A | 3/2012 |

* cited by examiner

*Primary Examiner* — Kaushikkumar Patel

(74) *Attorney, Agent, or Firm* — Volentine & Whitt, PLLC

(57) ABSTRACT

An operating method is for operating a memory controller which controls a non-volatile memory device. The non-volatile memory device includes a plurality of memory cells arranged in a direction perpendicular to a substrate. The operating method includes erasing the plurality of memory cells, reading memory cells connected with a first word line using a first word line voltage to search string address information corresponding to memory cells being at an off state, and programming memory cells corresponding to the string address information to a particular program state based on the string address information to store mapping information.

20 Claims, 15 Drawing Sheets

NON-VOLATILE MEMORY DEVICE AND OPERATING METHOD THEREOF

CROSS-REFERENCE TO RELATED APPLICATIONS

A claim for priority under 35 U.S.C. §119 is made to Korean Patent Application No. 10-2012-0140998 filed Dec. 6, 2012, in the Korean Intellectual Property Office, the entire contents of which are hereby incorporated by reference.

BACKGROUND

The inventive concepts described herein generally relate to non-volatile memory devices, and more particularly, the inventive concepts relate to non-volatile memory devices having memory cells arranged in a direction perpendicular to a substrate, and to operating methods of a non-volatile memory devices having memory cells arranged in a direction perpendicular to a substrate.

Memory devices are generally categorized as either volatile or non-volatile. A volatile memory device is characterized by the loss of stored data at a power-off state, whereas in contrast a non-volatile memory device is characterized by the retention of stored data at a power-off state. Examples of non-volatile memory include read only memory (ROM), electrically erasable programmable ROM (EEPROM), and the like.

Developed from EEPROM technology, a flash memory device is a type of non-volatile memory in which erase operations are carried out in units of memory blocks, and program operations are carried out in units of bits.

Flash memory is programmed by controlling a threshold voltage state of a memory cell. However, the programmed threshold voltage of a memory cell can vary as the result a variety of causes, such as floating gate coupling, charge loss over time, and so on. Any such variation in the programmed threshold voltage of a memory cell can adversely impact the reliability of a read operation.

Conventionally, flash memory cells have been formed in a two-dimensional array lying parallel to an underlying substrate. Recently, however, three-dimensional flash memory configurations have been developed which include memory cells arranged in a direction perpendicular to an underlying substrate.

SUMMARY

In one aspect of embodiments of the inventive concept, an operating method of a memory controller is provided which controls an operation of a non-volatile memory device. The non-volatile memory device includes a plurality of memory cells arranged in a direction perpendicular to a substrate. The operating method includes erasing the plurality of memory cells, reading memory cells connected with a first word line using a first word line voltage to search string address information corresponding to memory cells being at an off state, and programming memory cells corresponding to the string address information to a particular program state based on the string address information to store mapping information.

In another aspect of embodiments of the inventive concept, an operating method of a non-volatile memory device is provided. The non-volatile memory device which comprises at least one cell string including a plurality of memory cells, a string select transistor and a ground select transistor arranged in a direction perpendicular to a substrate. The operating method includes erasing the plurality of memory cells, reading memory cells connected with a first word line using a first word line voltage, searching string address information corresponding to memory cells being at an off state, and storing mapping information indicating that memory cells corresponding to the string address information are programmed to a particular program state.

In yet another aspect of embodiments of the inventive concept, an operating method of a memory system is provided. The memory system includes a memory controller and a non-volatile memory, and the non-volatile memory includes a three-dimensional memory cell array comprising cell strings extending perpendicularly relative to a substrate and word lines intersecting the cell strings. The method includes identifying first string addresses corresponding to off-state cells among memory cells connected to a word line, and remaining second string addresses not corresponding to off-state cells among the memory cells connected to the word line, mapping original data corresponding to the first string addresses to first program states, and encoding the mapped data and data corresponding to the second string addresses.

BRIEF DESCRIPTION OF THE FIGURES

The above and other aspects and features will become apparent from the detailed description that follows with reference to the accompanying figures, wherein like reference numerals refer to like parts throughout the various figures unless otherwise specified, and wherein.

DETAILED DESCRIPTION

Figure 1:
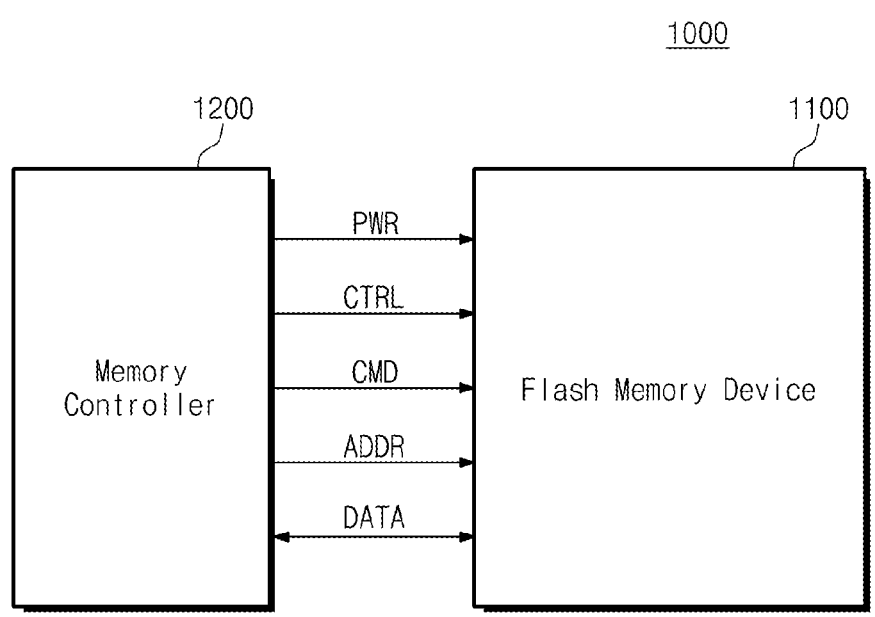
FIG. 1 is a block diagram schematically illustrating a flash memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a flash memory system according to an embodiment of the inventive concept. Referring to FIG. 1, a flash memory system 1000 may include a flash memory device 1100 and a memory controller 1200. The flash memory system 1000 may be physically embodied as any of a large variety of non-volatile memory based data storage media, a few examples of which include a memory card, a USB memory, a solid state drive (SSD), and so on.

The flash memory device 1100 may perform an erase, write or read operation according to a control of the memory controller 1200. The flash memory device 1100 may receive a command CMD, an address ADDR and data DATA through input/output lines. The flash memory device 1100 may receive a power PWR through a power line and a control signal CTRL through a control line. The control signal may include a command latch enable (CLE) signal, an address latch enable (ALE) signal, a chip enable (nCE) signal, a write enable (nWE) signal, a read enable (nRE) signal, and so on.

Figure 2:
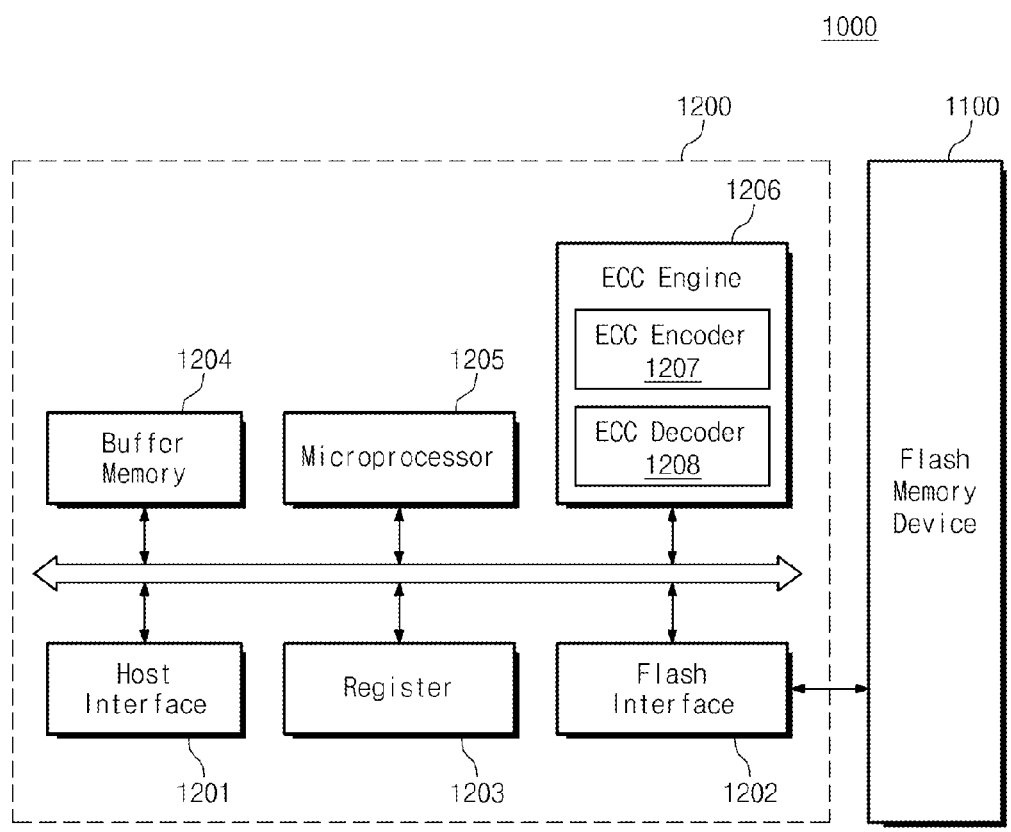
FIG. 2 is a block diagram schematically illustrating an example of a memory controller of the flash memory system of FIG. 1.

FIG. 2 is a block diagram schematically illustrating an example of a memory controller of FIG. 1. Referring to FIG. 2, a memory controller 1200 may include a host interface 1201, a flash interface 1202, a register 1203, a buffer memory 1204, a microprocessor 1205, and an ECC engine 1206. The components 1201 to 1206 of the memory controller 1200 may be electrically connected to each other through a bus.

The host interface 1201 may be used to exchange data with a host, and the flash interface 1202 may be used to exchange data with the flash memory device 1100. The flash interface 1202 may be connected with I/O pads of the flash memory device 1100 to exchange data. The flash interface 1202 may generate commands for the flash memory device 1100 to provide them to the flash memory device 1100 through the I/O pads.

The microprocessor 1205 may control an overall operation of the flash memory system 1000 including the memory controller 1200, and may control write, read and erase operations of the flash memory device 1100. If the flash memory system 1000 is powered on, the microprocessor 1205 may control an overall operation of the flash memory system 1000 by driving firmware for an operation of the flash memory system 1000 on the buffer memory 1204. Intervention or control of the microprocessor 1205 may include direct control of the microprocessor 1205 and interference of the firmware driven by the microprocessor 1205.

The buffer memory 1204 may temporarily store data to be programmed at the flash memory device 1100 or data to be provided to the host. In other words, the buffer memory 1204 may store a first command, data and various variables provided from the host or data output from the flash memory device 1100. That is, the buffer memory 1204 may store data provided and output from the flash memory device 1100, various parameters and variables.

The buffer memory 1204 may be used to drive firmware such as a flash translation layer (FTL). The FTL may be executed by the microprocessor 1205. The buffer memory 1204 may be formed of a volatile memory (e.g., DRAM, SRAM, etc.) or a non-volatile memory (e.g., PRAM, MRAM, flash memory, etc.).

The ECC engine 1206 may detect an error bit to correct it. A correctable error bit number of the ECC engine 1206 is not limited. The ECC engine 1206 may correct a bit error when the number of error bits detected is within a correction capacity. The ECC engine 1206 may not correct a bit error when the number of error bits detected is in excess of a correction capacity.

The ECC engine 1206 may include an ECC encoder 1207 and an ECC decoder 1208. The ECC engine 1206 may generate parity bits of an error correction code (ECC) using data transferred to the flash memory device 1100. The parity bits may be stored at the flash memory device 1100 together with main data. The main data may be stored at a main area of the flash memory device 1100, and the parity bits may be stored at a spare area of the flash memory device 1100.

The ECC decoder 1208 may perform error correction decoding on data read from the flash memory device 1100. The ECC decoder 1208 may determine whether the error correction decoding is successful, and may output an instruction signal according to the determination result. The ECC decoder 1208 may correct error bits of data using parity bits. If the number of error bits exceeds a correctable error bit limit, the ECC decoder 1208 may generate an error correction fail signal indicating that error bits have not been corrected.

The ECC encoder 1207 and the ECC decoder 1208 may correct an error using an LDPC (low density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. However, the inventive concept is not limited to these examples.

Figure 3:
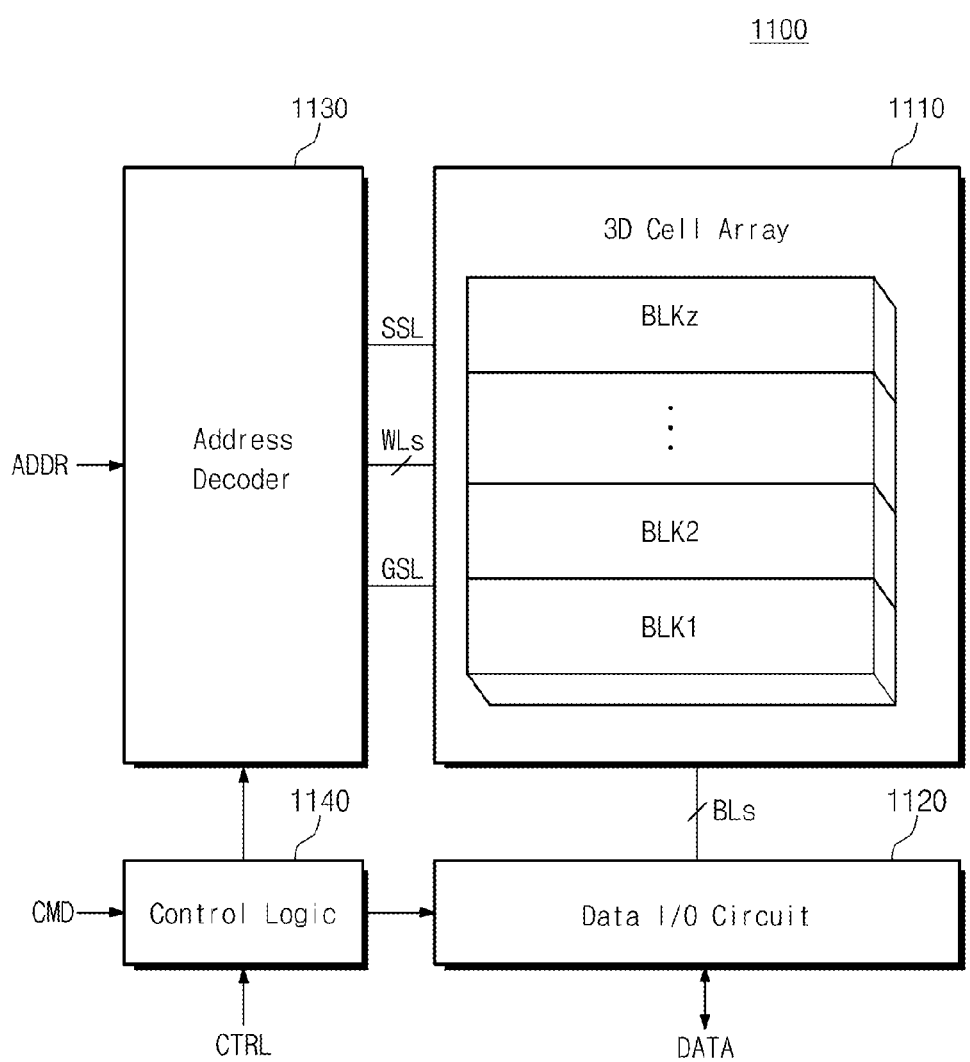
FIG. 3 is a block diagram schematically illustrating an example of a flash memory device of the flash memory system of FIG. 1.

FIG. 3 is a block diagram schematically illustrating an example of a flash memory device of the flash memory system of FIG. 1. In FIG. 3, there is exemplarily illustrated a three-dimensional flash memory device. Referring to FIG. 3, a flash memory device 1100 may include a three-dimensional (3D) cell array 1110, a data input/output circuit 1120, an address decoder 1130, and control logic 1140.

The 3D cell array 1110 may include a plurality of memory blocks BLK1 to BLKz, each of which is formed to have a three-dimensional structure (or, a vertical structure). In a memory block having a two-dimensional (horizontal) structure, memory cells may be formed in a direction parallel with a substrate. In a memory block having a three-dimensional structure, memory cells may be formed in a direction perpendicular to the substrate. Each of the memory blocks BLK1 to BLKz may be an erase unit of the flash memory device 1000.

The data input/output circuit 1120 may be connected with the 3D cell array 1110 through a plurality of bit lines. The data input/output circuit 1120 may receive data from an external device and output data read from the 3D cell array 1110 to the external device.

The address decoder 1130 may be connected with the 3D cell array 1110 through a plurality of word lines and selection lines GSL and SSL. The address decoder 1130 may select the word lines in response to an address ADDR.

The control logic 1140 may control various operation of the flash memory 1000, such as programming, erasing and reading of the flash memory 1000. For example, in the case of programming, the control logic 1140 may control the address decoder 1130 such that a program voltage is supplied to a selected word line and the data input/output circuit 1120 such that data is programmed.

Figure 4:
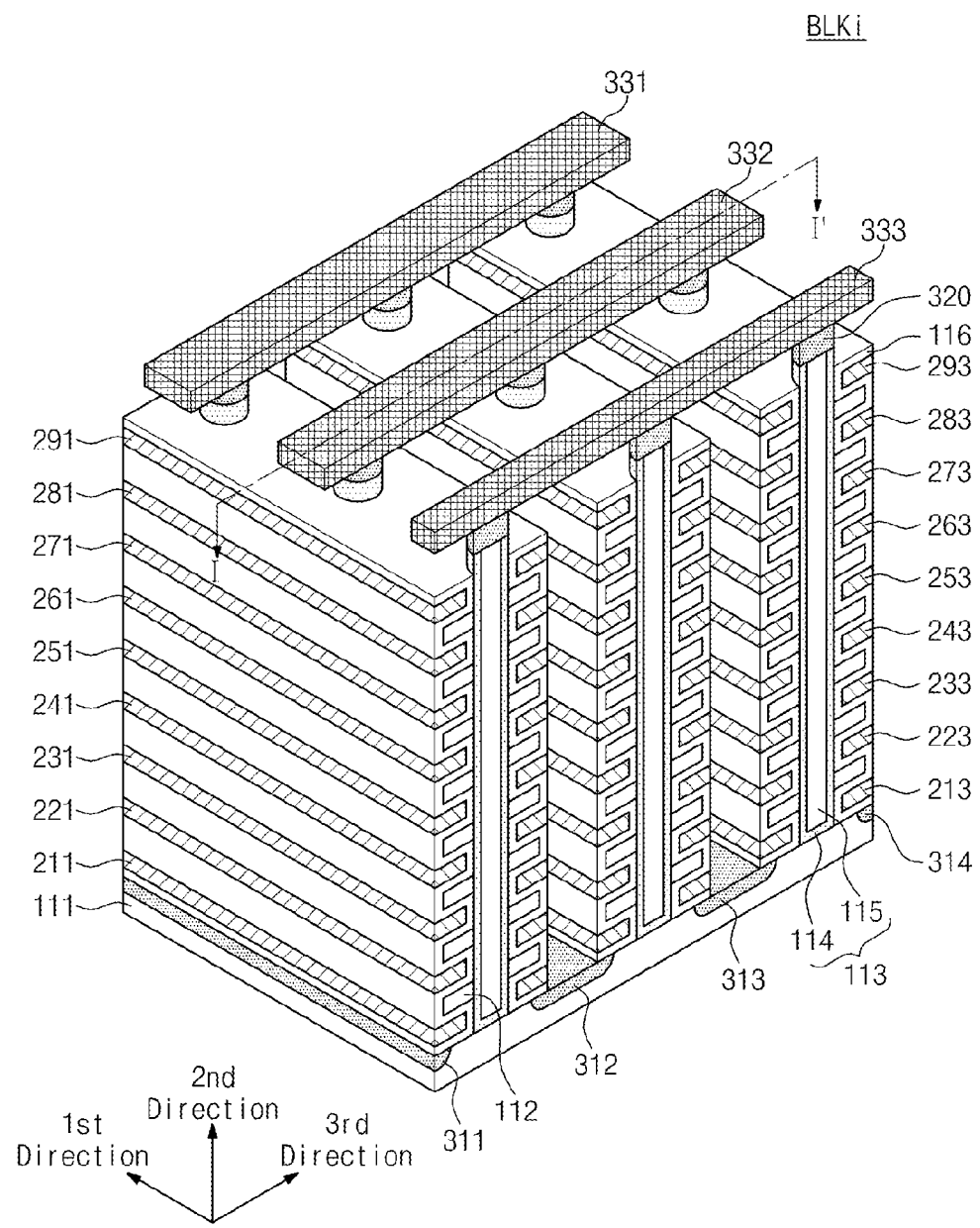
FIG. 4 is a perspective view of an example of a memory block BLKi of the flash memory device of FIG. 3.
Figure 5:
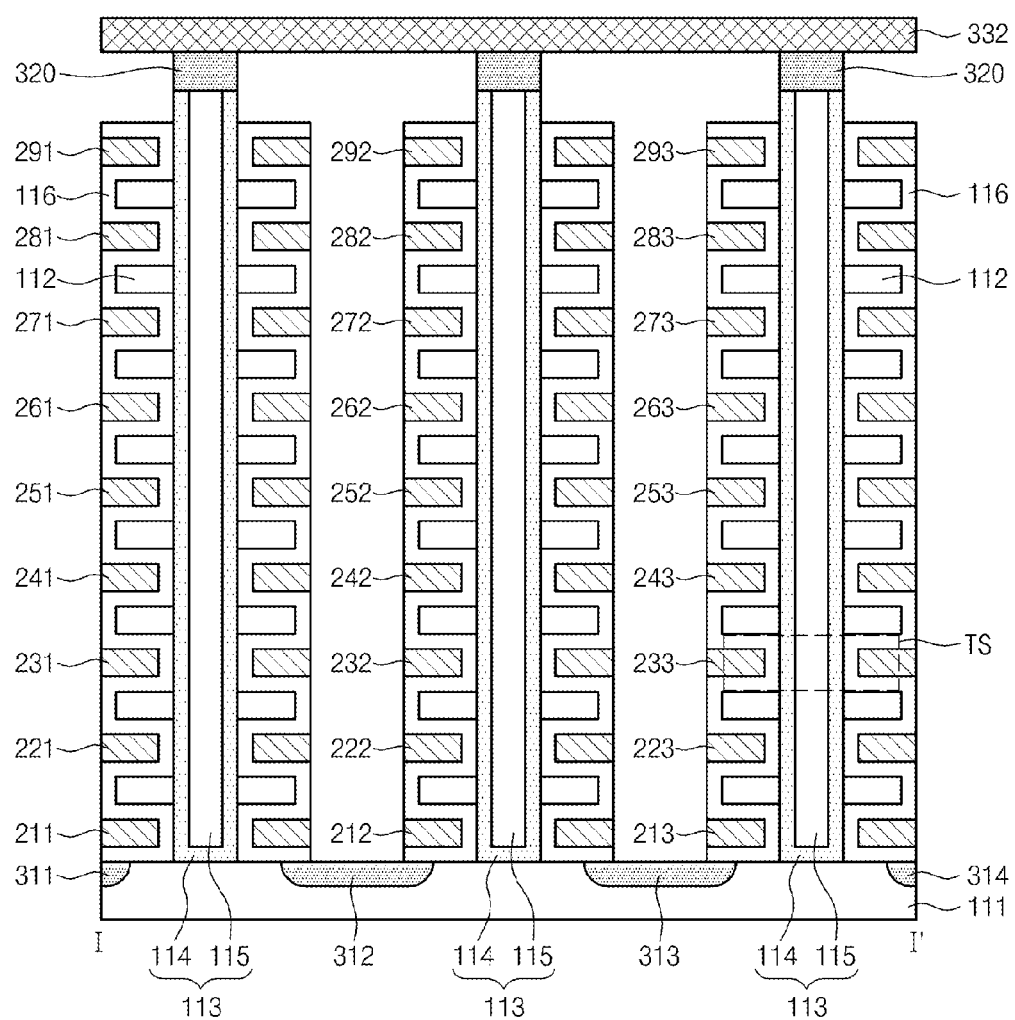
FIG. 5 is a cross-sectional view taken along a line I-I' of the memory block BLKi of FIG. 4.

FIG. 4 is a perspective view of an example of one memory block BLKi of FIG. 3, and FIG. 5 is a cross-sectional view taken along a line I-I' of FIG. 4. Referring to FIGS. 4 and 5, a memory block BLKi may include structures extending along first to third directions.

First, a substrate 111 may be provided. The substrate 111 may include a silicon material doped by first type impurity. For example, the substrate 111 may include a silicon material doped by p-type impurity or be a p-type well (e.g., a pocket p-well). Below, it is assumed that the substrate 111 is p-type silicon. However, the substrate 111 is not limited to p-type silicon.

A plurality of wells 311 to 314 extending along the first direction may be provided on the substrate 111. For example, the plurality of wells 311 to 314 may have a second impurity type differing from that of the substrate 111. For example, the plurality of wells 311 to 314 may be n-type. Below, it is assumed that the first to fourth wells 311 to 314 are n-type. However, the first to fourth wells 311 to 314 are not limited to n-type.

A plurality of insulation materials 112 extending along the first direction may be sequentially provided along the second direction over a region of the substrate 111 between the first and second n-wells 311 and 312. For example, the plurality of insulation materials 112 may be provided along the second direction such that they are spaced apart by a predetermined distance.

For example, the plurality of insulation materials 112 may be provided to be spaced apart from each other along the second direction. The insulation materials 112 may include an insulator such as silicon oxide.

A plurality of pillars 113 may be sequentially provided on a region of the substrate 111 between the first n-well 311 and the second n-well 312, and may be formed to penetrate the insulation materials 112 along the second direction. Exemplarily, the plurality of pillars 113 may penetrate the insulation materials 112 to contact with the substrate 111.

Each of the pillars 113 may be composed of a plurality of materials. For instance, a surface layer 114 of each pillar 113 may include a silicon material having a first impurity type. For example, the surface layer 114 of each pillar 113 may include a silicon material which is doped with the same impurity type as that of the substrate 111 and form a channel. Hereinafter, it is assumed that the surface layer 114 of each pillar 113 includes p-type silicon. However, the surface layer 114 of each pillar 113 is not limited to include p-type silicon.

An inner layer 115 of each pillar 113 may be formed of an insulation material. For example, the inner layer 115 of each pillar 113 may be filled with an insulation material such as silicon oxide.

In a region between the first and second n-wells 311 and 312, an insulation layer 116 may be provided along exposed surfaces of the insulation materials 112, the pillars 113, and the substrate 111. Exemplarily, the thickness of the insulation material 116 may be less than a half of the distance between the insulation materials 112. That is, a region, in which any material other than the insulation materials 112 and the insulation layer 116 is disposed, may be provided between the insulation layer 116 provided on an undersurface of the first insulation material of the insulation materials 112 and the insulation layer 116 provided on a top surface of the second insulation material under the first insulation material.

In the region between the first and second n-wells 311 and 312, conductive materials 211 to 291 may be provided on an exposed surface of the insulation layer 116. For example, the conductive material 211 extending along the first direction may be provided between the substrate 111 and the insulation layer 112 adjacent thereto. More specifically, the conductive material 211 extending along the first direction may be provided between the substrate 111 and the insulation layer 116 disposed under the insulation material 112 adjacent to the substrate 111.

A conductive material extending along the first direction may be provided between the insulation layer 116 on a top surface of a specific insulation material among the insulation materials 112 and the insulation layer 116 disposed on an undersurface of an insulation layer provided on a top of the specific insulation material. A plurality of conductive materials 221 to 281 extending along the first direction may be provided between the insulation materials 112. Also, the conductive material 291 extending along the first direction may be provided on the insulation materials 112. Exemplarily, the conductive materials 211 to 291 extending along the first direction may be a metallic material. Alternatively, the conductive materials 211 to 291 extending along the first direction may be a conductive material such as polysilicon.

A structure identical to a structure disposed on the first and second n-wells 311 and 312 may be provided in a region between the second and third n-wells 312 and 313. Exemplarily, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 212 to 292 extending along the first direction may be provided in the region between the second and third wells 312 and 313.

A structure identical to a structure disposed on the first and second n-wells 311 and 312 may be provided in a region between the third and fourth wells 313 and 314. Exemplarily, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 213 to 293 extending along the first direction may be provided in the region between the third and fourth wells 313 and 314. Gates (or, control gates) may correspond to the conductive materials 211 to 291, 212 to 292, and 213 to 293 extend along the first and second directions. That is, the gates (or, control gates) may extend along the first direction to form word lines and at least two select lines (e.g., at least one string select line SSL and at least one ground select line GSL).

Drains 320 may be respectively provided on the plurality of pillars 113. Exemplarily, the drains 320 may include a silicon material doped with a second impurity type material. For example, the drains 320 may include a silicon material doped with an n-type material. Hereinafter, it is assumed that the drains 320 include a silicon material doped with an n-type material. However, the drains 320 are not limited to include n-type silicon materials. In example embodiments, a width of each drain 320 may be wider than that of a corresponding pillar 113. For example, each drain 320 may be provided on a top surface of the corresponding pillar 113 in the shape of a pad.

Conductive materials 331 to 333 extending in the third direction may be respectively connected on the drains 320. The conductive materials 331 to 333 may be sequentially disposed along the first direction. The conductive materials 331 to 333 may be respectively connected to the drains 320 in the corresponding region. Exemplarily, the drains 320 and the second conductive material 333 extending along the third direction may be connected to each other through respective contact plugs. The conductive materials 331 to 333 may form bit lines. Exemplarily, the conductive materials 331 to 333 extending along the third direction may be a metallic material. Alternatively, the conductive materials 331 to 333 may be a conductive material such as polysilicon.

In FIGS. 4 and 5, each of the pillars 113 may form a string together with an adjacent region of the insulation layer 116 and an adjacent region of the plurality of conductive materials 211 to 291, 212 to 292, and 213 to 293. For example, each pillar 113 may form a NAND string NS together with an adjacent region to the insulation layer 116 and an adjacent region of the first conductive materials 211 to 291, 212 to 292, and 213 to 293 extending along the first direction. The NAND string NS may include a plurality of transistor structures TS.

Each NAND string NS may include a pillar which electrically connects a string select transistor SST, a ground select transistor GST, and memory cells. Each drain 320 may be provided on each pillar 113. For example, a drain 320 may be provided on a corresponding pillar 113 in a pad shape. The drains 320 may be electrically connected with the string select transistors SST. The conductive lines 331 to 333, that is, bit lines may be connected with drains 320 in corresponding regions. As described above, the drains 320 and the bit lines may be connected through contact plugs.

Figure 6:
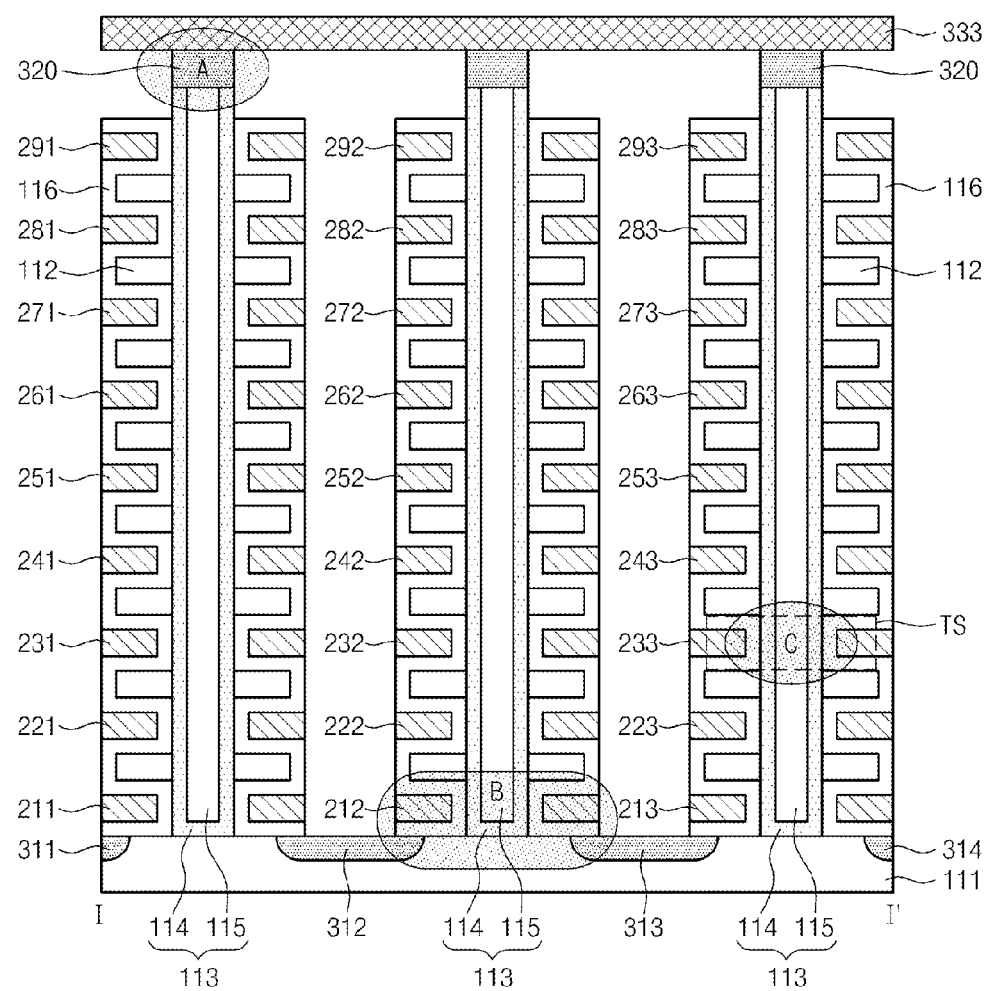
FIG. 6 is a cross-sectional diagram for describing an example of a defect in a NAND string of a memory block such as that shown in FIG. 5.

FIG. 6 is a diagram an example of a defect of a NAND string of a memory block of FIG. 5.

Referring to a portion A of FIG. 6, in a NAND string, a defect may be generated at a pad portion between a drain 320 and a bit line during a fabrication process. In this case, a channel of a NAND string may not be formed.

A string select transistor SST and a contact plug 320 may not be electrically connected due to a defect during a fabrication process. That is, a NAND string may not be connected with a bit line due to a defect of a fabrication process of the contact plug 320. In this case, all memory cells in the NAND string may always retain off states regardless of original data programed.

Referring to a portion B of FIG. 6, in a NAND string, a ground select transistor and a substrate may not be connected due to a defect in a fabrication process. Likewise, a channel of the NAND string may not be formed.

Figure 7:
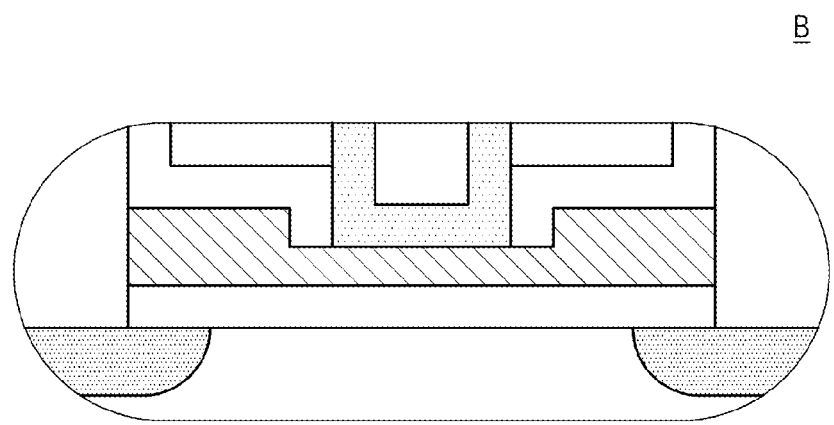
FIG. 7 is an enlarged diagram of a portion B of FIG. 6.

FIG. 7 is an enlarged diagram of a portion B of FIG. 6.

Referring to FIG. 7, a ground select transistor (GST) 212 may not be connected with a substrate and a pillar due to a defect for a process when a non-volatile memory device is fabricated. For example, a pillar may not be connected with the ground select transistor (GST) 212 when an etching process for forming the pillar is not performed successfully.

Returning to a portion C of FIG. 6, a string channel may not be formed when an etching or deposition process for forming a channel of a memory cell is not performed successfully. Memory cells included in a string where no channel is formed may be always read as off states regardless of program data.

Figure 8:
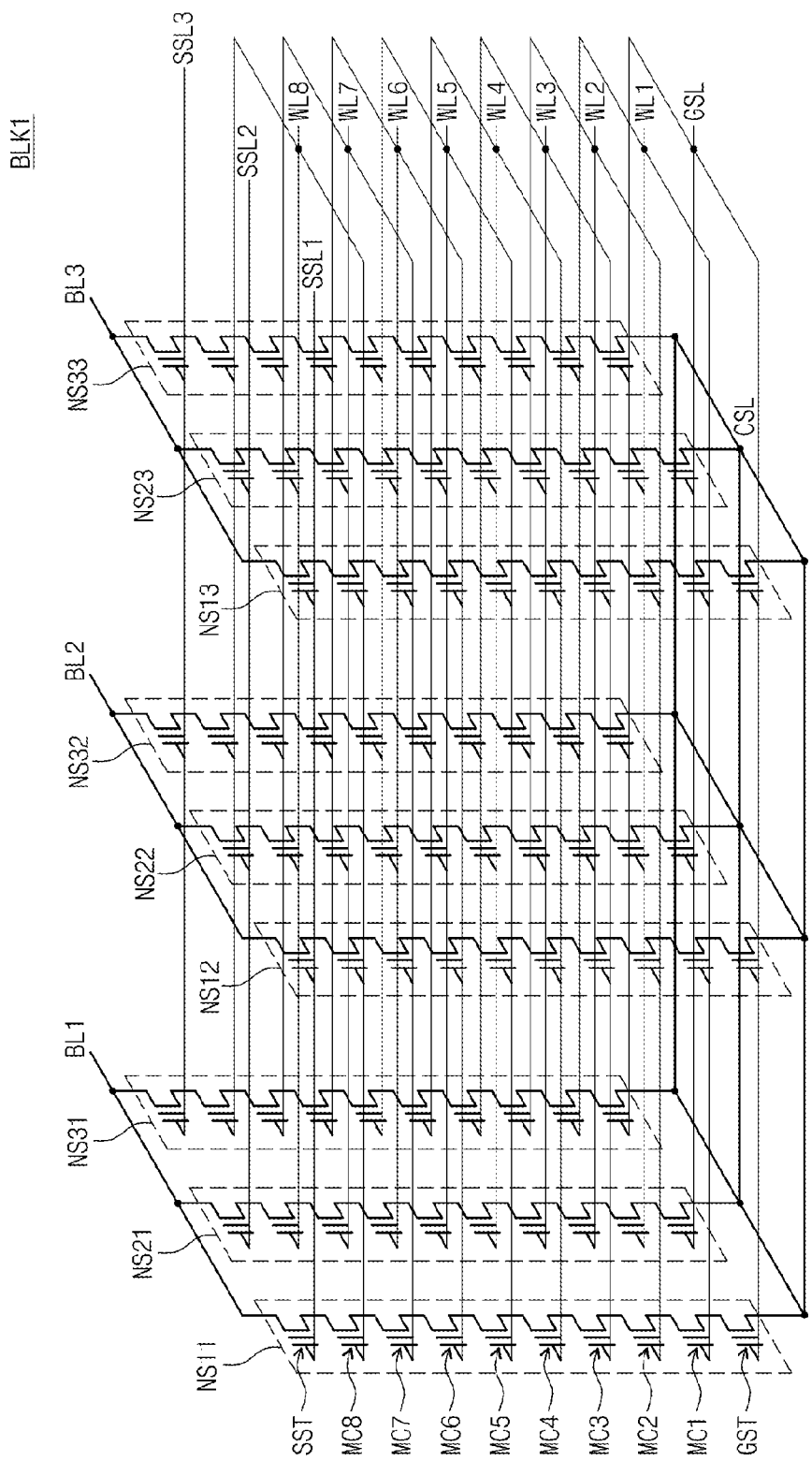
FIG. 8 is an equivalent circuit diagram of a memory block BLKi of FIG. 4.

FIG. 8 is an equivalent circuit diagram of a memory block BLKi of FIG. 4. Referring to FIG. 8, NAND strings NS11 to NS33 may be provided between bit lines BL1 to BL3 and a common source line CSL.

Each NAND string (e.g., NS11) may include a string select transistor SST, a plurality of memory cells MC1 to MC8, and a ground select transistor GST. The string select transistors SST may be connected with string select lines SSL1 to SSL3. The memory cells MC1 to MC8 may be connected with corresponding word lines WL1 to WL8. The ground select transistors GST may be connected with a ground select line GSL. In each NAND string, the string select transistor SST may be connected with a corresponding bit line and the ground select transistor GST may be connected with the common source line CSL.

Word lines (e.g., WL1) having the same height may be connected in common to form a first word line, and the string select lines SSL1 to SSL3 may be separated from each other. In the event that memory cells (hereinafter, referred to as a page) connected with the first word line and belonging to the NAND strings NS11, NS12 and NS13 are programmed, the first word line WL1 and the first string select line SSL1 may be selected.

A read operation on the first word line may be performed by providing a first pass voltage to the first word line. The first pass voltage may be a voltage higher than a threshold voltage corresponding to a predetermined program state of a three-dimensional flash memory device. In the event that the flash memory device is not programmed, the first pass voltage may be a voltage corresponding to an erase state. In example embodiments, the first word line may be the lowermost word line of a three-dimensional stack cell array.

A NAND string where a string select transistor SST is not connected with a bit line may always be an off state at a read operation. Memory cells of a NAND string where a ground select transistor is not connected with a substrate may always be off states when the first pass voltage is applied thereto. Also, a NAND string where an electric channel of a particular memory cell is not formed may be an off state.

The inventive concept relates to a method of correcting an error bit generated when a channel is not formed due to a defect occurring during fabrication of a three-dimensional flash memory device. In error prediction, a physical short circuit of channels due to a process defect may differ from that due to a characteristic of a memory cell. That is, an error due to a characteristic of a memory cell may not be easily predicted. However, it is possible to predict a physical short circuit of channels resulting from a fabrication process.

In the inventive concept, an error caused by a physical short circuit of channels may be detected through a read operation. That is, such a case that all memory cells are erased and then a result of a read operation indicates data corresponding to an off state may be predicted to be the result of a physical short circuit of channels.

Returning to FIG. 3, control logic 1140 may apply a first pass voltage to a first word line, check address information of a NAND string corresponding to a memory cell, having an off state, from among memory cells connected with the first word line, and store the address information checked at a memory cell array. Alternatively, the control logic 1140 may provide NAND string address information to a memory controller 1200. The NAND string address information may include a bit line address and a block address, or may include a part of a page together with a bit line address and a block address.

Figure 9:
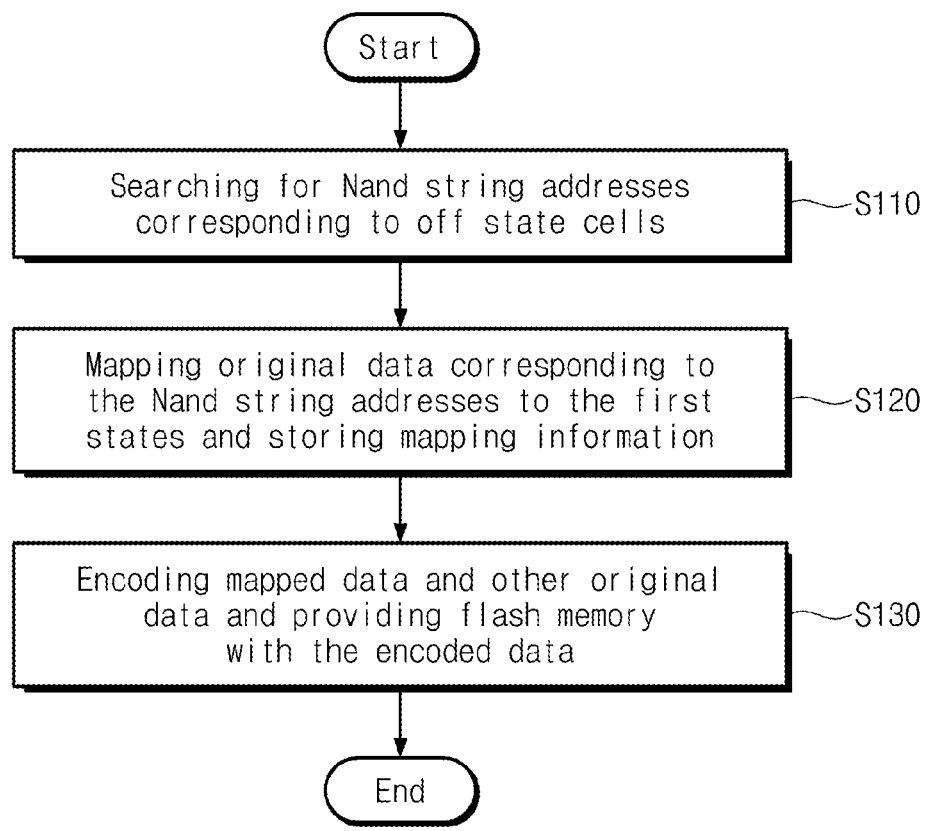
FIG. 9 is a flow chart for reference in describing an operating method of a flash memory system according to an embodiment of the inventive concept.

FIG. 9 is a flow chart schematically illustrating an operating method of a flash memory system according to an embodiment of the inventive concept.

In operation S110, address information of a NAND string corresponding to a memory cell being at an off state may be searched. Referring to FIGS. 2 and 3, a memory controller 1200 may control an operation of a flash memory device 1100 having a plurality of cell string arranged in a direction perpendicular to a substrate. The memory controller 1200 may control the flash memory device to apply a first word line voltage to a first word line, read memory cells included in the first word line and search NAND string address information corresponding to memory cells being at an off state.

The first word line voltage may be a voltage higher than a threshold voltage corresponding to a predetermined program state. Off state cells may be cells included in a NAND string where an electric channel is not formed due to a defect for a process. For example, the off state cells may be generated when a channel is not formed due to a defect of a memory cell, when a ground select transistor is not electrically connected to a substrate, and when a string select transistor is not electrically connected to a bit line.

In operation S120, the memory controller 120 may map original data corresponding to the NAND string address information to a program state based on the NAND string address information searched and store the mapping information at the flash memory device 1100 or a register 1203. The program state may be a state having a threshold voltage higher than the uppermost program state of the flash memory device 1100.

In operation S130, an ECC decoder 1207 of the memory controller 1200 encodes the mapped data and original data not corresponding to the searched address information to provide encoded data to the flash memory device 1100. The flash memory device 1100 may program data provided from the memory controller 1200.

With a three-dimensional flash memory of the inventive concept, a bit error may be readily predicted when a channel is short circuited during a fabrication process, and a bit error ratio may be efficiently improved.

Figure 10:
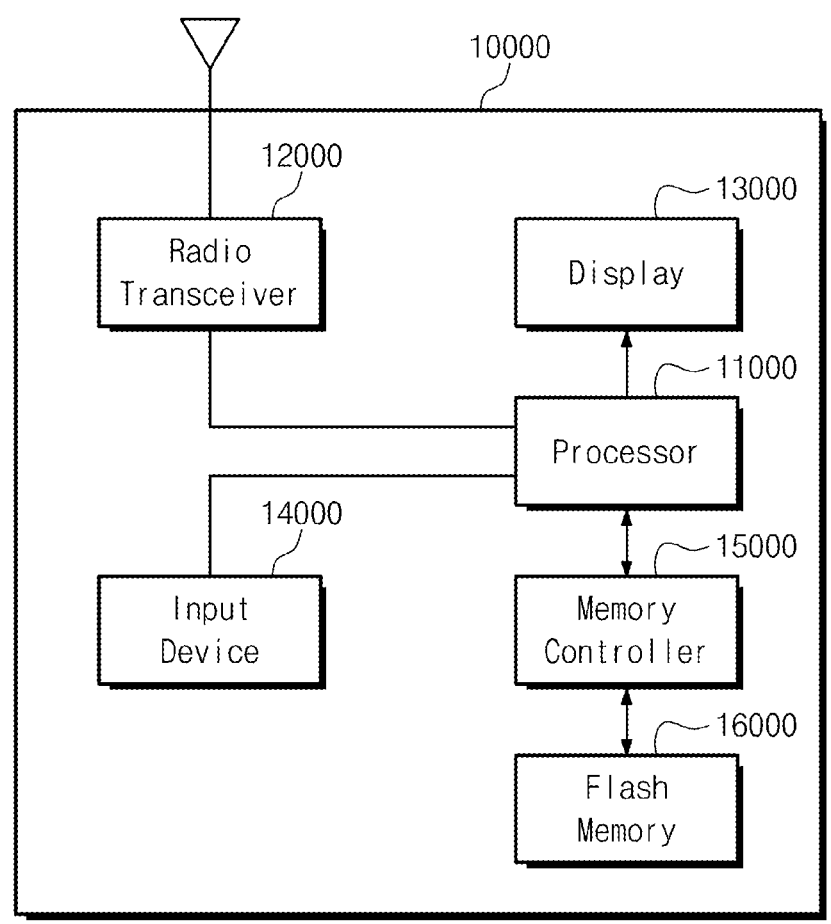
FIG. 10 is a block diagram schematically illustrating an electronic device 10000 including a memory controller 15000 and a non-volatile memory device 16000 according to an embodiment of the inventive concept.

FIG. 10 is a block diagram schematically illustrating an electronic device 10000 including a memory controller 15000 and a non-volatile memory device 16000 according to an embodiment of the inventive concept.

Referring to FIG. 10, an electronic device 10000 such as a cellular phone, a smart phone, or a tablet PC may include a non-volatile memory device 16000 implemented by a flash memory device and a memory controller 15000 to control the non-volatile memory device 16000.

The memory controller 15000 may be controlled by a processor 11000 which controls an overall operation of the electronic device 10000.

Data stored at the non-volatile memory device 16000 may be displayed through a display 13000 according to a control of the memory controller 15000 which operates according to a control of the processor 11000. The memory controller 15000 and/or non-volatile memory device 16000 may be configured as described above in connection with FIGS. 1 through 9.

A radio transceiver 12000 may change a radio signal through an antenna. For example, the radio transceiver 12000 may convert a radio signal received through the antenna into a signal capable of being processed by the processor 11000. Thus, the processor 11000 may process a signal from the radio transceiver 12000, and may store the processed signal at the non-volatile memory device 16000. Or, the processor 11000 may display the processed signal through the display 13000.

The radio transceiver 12000 may convert a signal from the processor 11000 into a radio signal, and may output the converted radio signal to the exterior through the antenna.

An input device 14000 may be a device that receives a control signal for controlling an operation of the processor 11000 or data to be processed by the processor 11000, and may be implemented by a pointing device such as a touch pad or a computer mouse, a key pad, or a keyboard.

The processor 11000 may control the display 13000 such that data from the non-volatile memory device 16000, a radio signal from the radio transceiver 12000 or data from the input device 14000 is displayed through the display 13000.

Figure 11:
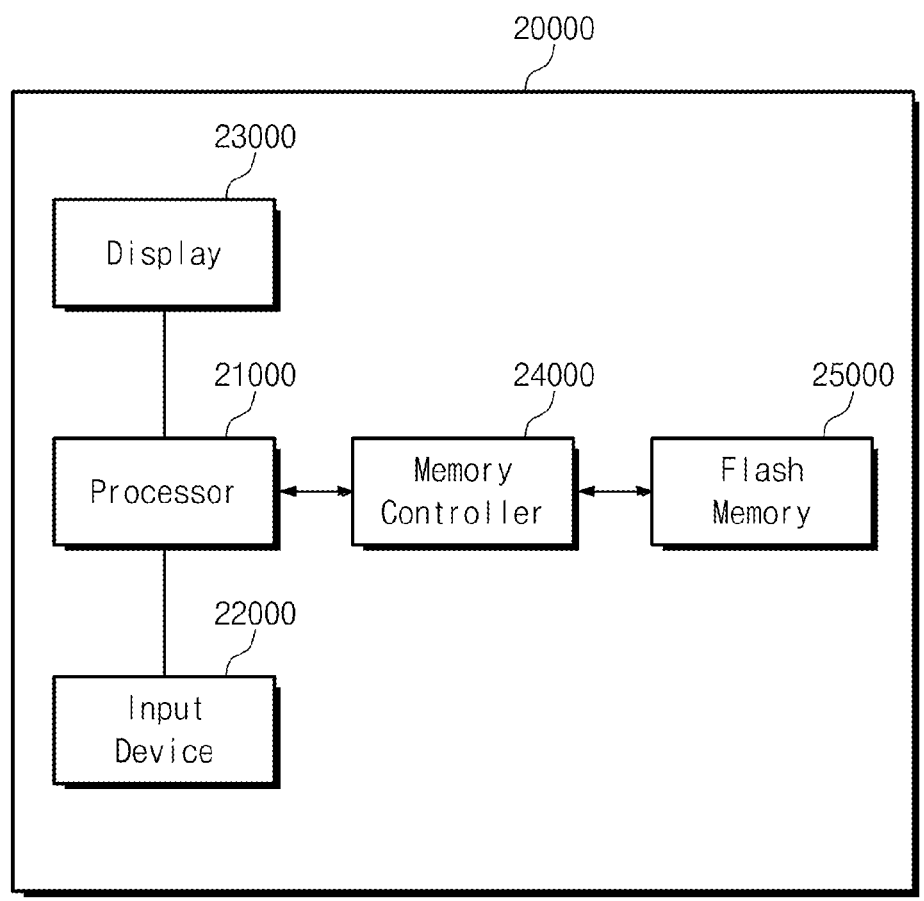
FIG. 11 is a block diagram schematically illustrating an electronic device including a memory controller and a non-volatile memory device according to another embodiment of the inventive concept.

FIG. 11 is a block diagram schematically illustrating an electronic device 20000 including a memory controller 24000 and a non-volatile memory device 25000 according to another embodiment of the inventive concept.

Referring to FIG. 11, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and may include a non-volatile memory device 25000 (e.g., a flash memory device) and a memory controller 24000 to control an operation of the non-volatile memory device 25000.

The memory controller 24000 and/or non-volatile memory device 25000 may be configured as described above in connection with FIGS. 1 through 9. The non-volatile memory device 25000 may store random data.

The electronic device 20000 may include a processor 21000 to control an overall operation of the electronic device 20000. The memory controller 24000 may be controlled by the processor 21000.

The processor 21000 may display data stored at the non-volatile memory device 25000 through a display 23000 according to an input signal generated by an input device 22000. For example, the input device 22000 may be implemented by a pointing device such as a touch pad or a computer mouse, a key pad, or a keyboard.

Figure 12:
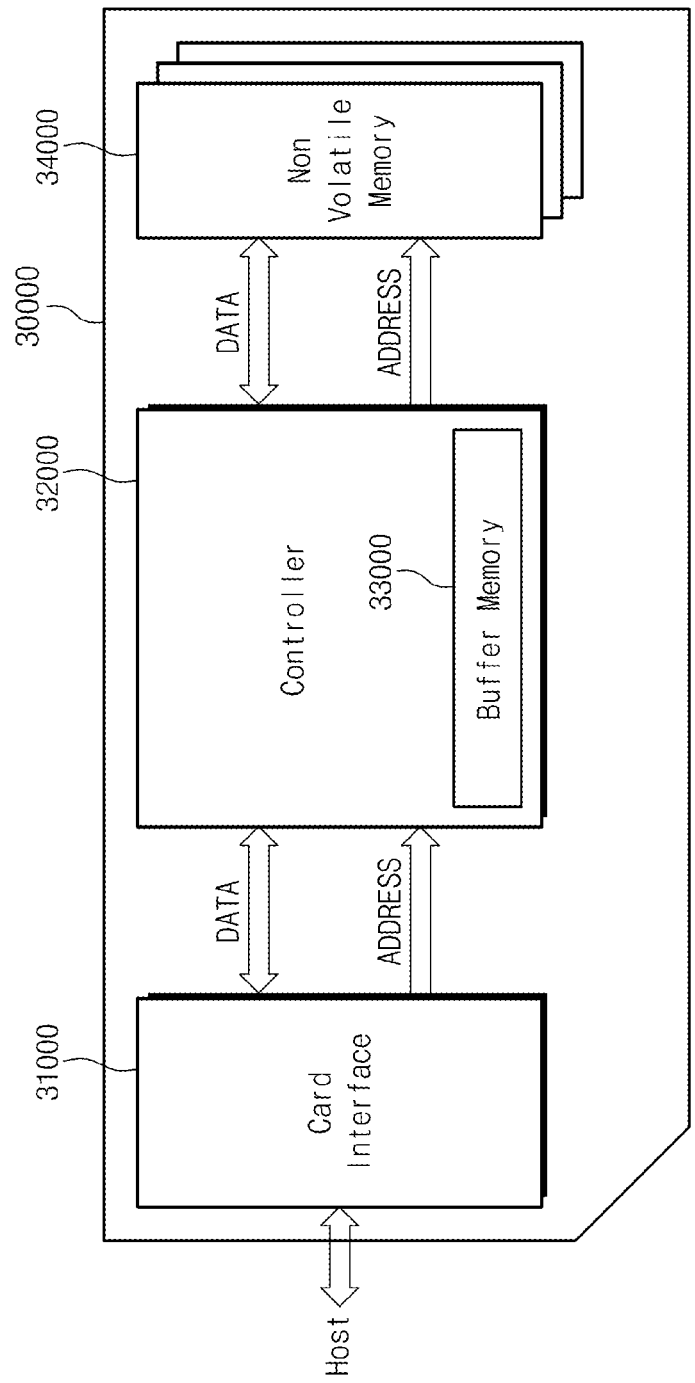
FIG. 12 is a block diagram schematically illustrating an electronic device including a non-volatile memory device according to still another embodiment of the inventive concept.

FIG. 12 is a block diagram schematically illustrating an electronic device 30000 including a non-volatile memory device 34000 according to still another embodiment of the inventive concept.

Referring to FIG. 12, an electronic device 30000 may include a card interface 31000, a memory controller 32000, and a non-volatile memory device 34000 (e.g., a flash memory device).

The electronic device 30000 may exchange data with a host through the card interface 31000. The card interface 31000 may be an SD (Secure Digital) card interface or an MMC (Multi-Media Card) interface. However, the inventive concept is not limited thereto. The card interface 31000 may interface data exchange between the host and the memory controller 32000 according to the communications protocol of the host capable of communicating the electronic device 30000.

The memory controller 32000 may control an overall operation of the electronic device 30000, and may control exchange of data between the card interface 31000 and the non-volatile memory device 34000. A buffer memory 33000 of the memory controller 32000 may buffer data transferred between the card interface 31000 and the non-volatile memory device 34000.

The memory controller 32000 may be connected with the card interface 31000 and the non-volatile memory device 34000 through a data bus DATA and an address bus ADDRESS. According to an embodiment, the memory controller 32000 may receive an address of data to be read or written from the card interface 31000 through the address bus ADDRESS, and may send it to the non-volatile memory device 34000.

Also, the memory controller 32000 may receive or transfer data to be read or written through the data bus DATA connected with the card interface 31000 or the non-volatile memory device 34000. The memory controller 32000 and/or non-volatile memory device 34000 may be configured as described above in connection with FIGS. 1 through 9. The non-volatile memory device 34000 may store random data.

When the electronic device 30000 is connected with a host such as a PC, a tablet PC, a digital camera, a digital audio player, a mobile phone, console video game hardware or a digital set-top box, the host may exchange data stored at the non-volatile memory device 34000 through the card interface 31000 and the memory controller 32000.

Figure 13:
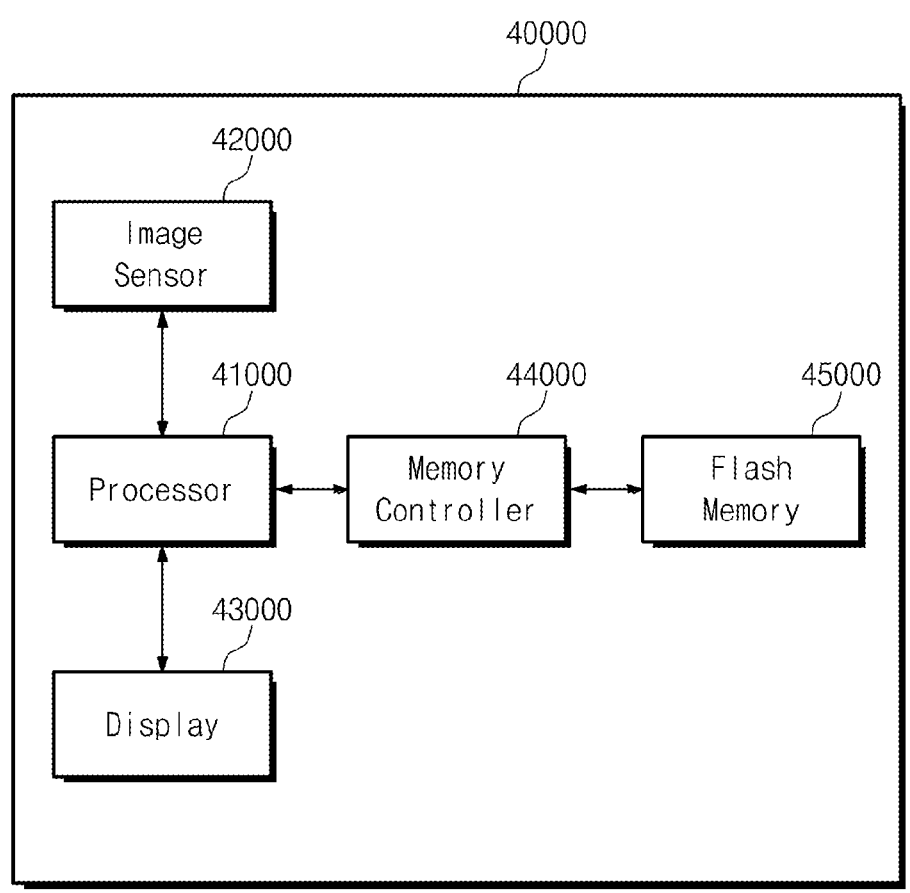
FIG. 13 is a block diagram schematically illustrating an electronic device including a memory controller and a non-volatile memory device according to still another embodiment of the inventive concept.

FIG. 13 is a block diagram schematically illustrating an electronic device including a memory controller and a non-volatile memory device according to still another embodiment of the inventive concept.

Referring to FIG. 13, an electronic device 40000 may include a non-volatile memory device 45000 (e.g., a flash memory device), a memory controller 44000 to control a data processing operation of the non-volatile memory device 45000, and a processor 41000 to control an overall operation of the electronic device 40000. The memory controller 44000 and/or non-volatile memory device 45000 may be configured as described above in connection with FIGS. 1 through 9.

An image sensor 42000 of the electronic device 40000 may convert an optical signal into a digital signal, and the converted digital signal may be stored at the non-volatile memory device 45000 under the control of the processor 41000. Or, the converted digital signal may be displayed through a display 43000 under the control of the processor 41000.

Figure 14:
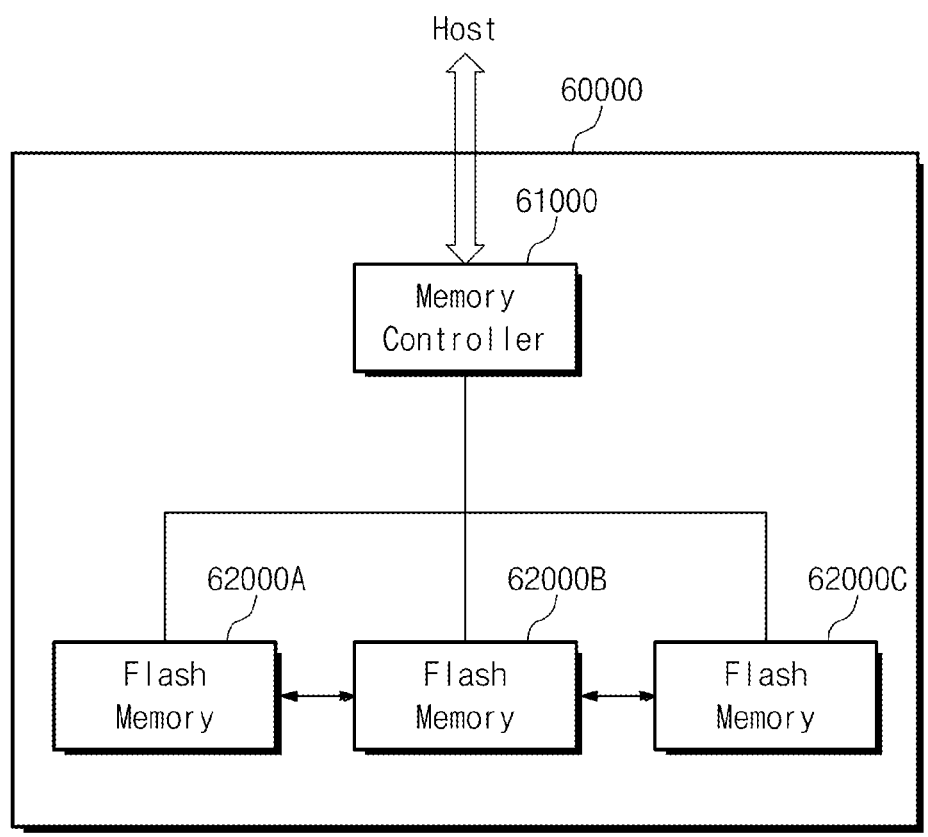
FIG. 14 is a block diagram schematically illustrating an electronic device including a memory controller and non-volatile memory devices according to still another embodiment of the inventive concept.

FIG. 14 is a block diagram schematically illustrating an electronic device 60000 including a memory controller 61000 and non-volatile memory devices 62000A, 62000B, and 62000C according to still another embodiment of the inventive concept. Referring to FIG. 14, an electronic device 60000 may be implemented by a data storage device such as a solid state drive (SSD).

The electronic device 60000 may include non-volatile memory devices 62000A, 62000B, and 62000C and a memory controller 61000 to control a data processing operation of each of the non-volatile memory devices 62000A, 62000B, and 62000C.

The electronic device 60000 may be implemented by a memory system or a memory module.

The memory controller 61000 and/or each of the non-volatile memory devices 62000A, 62000B, and 62000C may be configured as described above in connection with FIGS. 1 through 9. The non-volatile memory devices 62000A, 62000B, and 62000C may store random data. The memory controller 61000 may be implemented outside or inside electronic device 60000 according to an embodiment.

Figure 15:
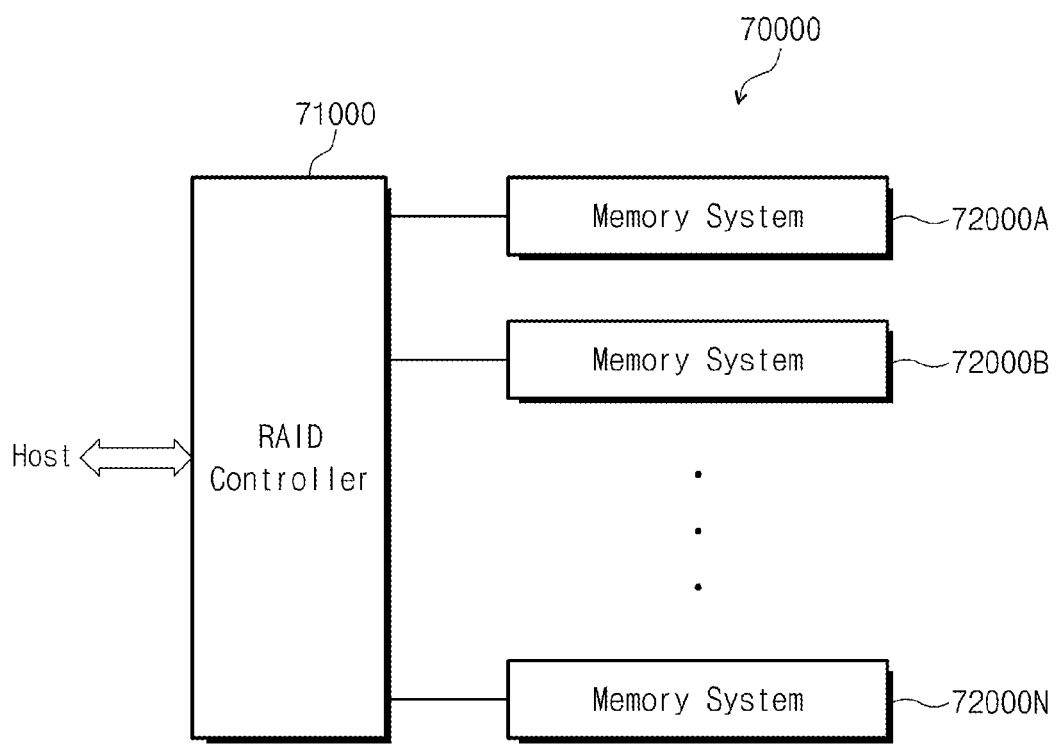
FIG. 15 is a block diagram of a data processing system including an electronic device illustrated in FIG. 14.

FIG. 15 is a block diagram of a data processing system including an electronic device illustrated in FIG. 14. Referring to FIGS. 14 and 14, a data storage device 70000 may be implemented by a RAID (Redundant Array of Independent Disks) system. The data storage device 70000 may include a RAID controller 71000 and a plurality of memory systems 72000A to 72000N (N being a natural number).

Each of the memory systems 72000A to 72000N may be an electronic device 40000 as shown in FIG. 14. The memory systems 72000A to 72000N may form an RAID array. The data storage device 70000 may be implemented by a personal computer or an SSD.

During a program operation, the RAID controller 71000 may output program data output from a host to one of the memory systems 72000A to 72000N according to one selected from a plurality of RAID levels based on RAID level information output from the host.

During a read operation, the RAID controller 71000 may transfer data read from one of the memory systems 72000A to 72000N to the host according to one selected from a plurality of RAID levels based on RAID level information output from the host.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An operating method of a memory controller which controls an operation of a non-volatile memory device, the non-volatile memory device including a plurality of memory cells arranged in a direction perpendicular to a substrate, the operating method comprising:
    erasing the plurality of memory cells;
    reading memory cells connected with a first word line using a first word line voltage to search string address information corresponding to memory cells being at an off state; and
    programming memory cells corresponding to the string address information to a particular program state based on the string address information to store mapping information.

2. The operating method of claim 1, wherein the mapping information and data of memory cells not corresponding to the string address information are encoded, and the encoded data is provided to the non-volatile memory device.

3. The operating method of claim 1, wherein the mapping information is stored at the non-volatile memory device.

4. The operating method of claim 1, wherein when all the memory cells are at an erase state, the first word line voltage is a threshold voltage for determining an erase state.

5. The operating method of claim 1, wherein the first word line voltage is higher than a threshold voltage corresponding to a program state of the non-volatile memory device.

6. The operating method of claim 1, wherein the particular program state has a threshold voltage higher than an uppermost program state of the non-volatile memory device.

7. The operating method of claim 1, wherein the string address information is stored at one of the non-volatile memory device and the memory controller.

8. The operating method of claim 1, wherein the memory cells are configured as NAND flash memory cell strings.

9. An operating method of a non-volatile memory device which comprises at least one cell string including a plurality of memory cells, a string select transistor and a ground select transistor arranged in a direction perpendicular to a substrate, the operating method comprising:
    erasing the plurality of memory cells;
    reading memory cells connected with a first word line using a first word line voltage;
    searching string address information corresponding to memory cells being at an off state; and
    storing mapping information indicating that memory cells corresponding to the string address information are programmed to a particular program state.

10. The operating method of claim 9, further comprising:
    programming an encoding result of the mapping information and an encoding result of data of memory cells not corresponding to the searched address, at a memory cell array.

11. The operating method of claim 9, wherein the string select transistor is not electrically connected with a bit line.

12. The operating method of claim 9, wherein the ground select transistor is not electrically connected with the substrate.

13. The operating method of claim 9, wherein memory cells being at an off state are included in a string where a channel for electrically connecting the memory cells is not formed.

14. The operating method of claim 9, wherein the program state has a threshold voltage higher than an uppermost program state of the non-volatile memory device.

15. The operating method of claim 9, wherein the non-volatile memory device is a NAND flash memory.

16. An operating method of a memory system, the memory system including a memory controller and a non-volatile memory, the non-volatile memory including a three-dimensional memory cell array comprising cell strings extending perpendicularly relative to a substrate and word lines intersecting the cell strings, the method comprising:
    identifying first string addresses corresponding to off-state cells among memory cells connected to a word line, and remaining second string addresses not corresponding to off-state cells among the memory cells connected to the word line;
    mapping original data corresponding to the first string addresses to first program states; and
    encoding the mapped data and data corresponding to the second string addresses.

17. The operating method of claim 16, further comprising storing the mapped data prior to encoding the mapped data.

18. The operating method of claim 16, further comprising providing the non-volatile memory with the encoded data.

19. The operating method of claim 16, wherein identifying the first string addresses includes:
    erasing the memory cells;
    reading the memory cells connected to the word line using a first word line voltage;
    searching string address information corresponding to memory cells which are read as being in an off state.

20. The operating method of claim 16, wherein the memory cells are configured as NAND flash memory cell strings.

* * * * *